United States Patent [19]

Wheeler et al.

[11] Patent Number: 4,694,416
[45] Date of Patent: Sep. 15, 1987

[54] VLSI PROGRAMMABLE DIGITAL SIGNAL PROCESSOR

[75] Inventors: James E. Wheeler, Schenectady; Robert M. Hardy, Scotia; Robert J. Dunki-Jacobs, Saratoga; William J. Premerlani, Scotia, all of N.Y.

[73] Assignee: General Electric Company, Schenectady, N.Y.

[21] Appl. No.: 705,290

[22] Filed: Feb. 25, 1985

[51] Int. Cl.⁴ .......................... G06F 7/38; G06F 15/00
[52] U.S. Cl. .................................... 364/736; 364/200
[58] Field of Search ............... 364/736, 200 MS File, 364/900 MS File

[56] References Cited

U.S. PATENT DOCUMENTS

| | | | |
|---|---|---|---|
| 3,875,391 | 4/1975 | Shapiro et al. | 364/736 |
| 3,978,452 | 8/1976 | Barton et al. | 364/200 |
| 4,313,174 | 1/1982 | White | 364/753 |
| 4,484,349 | 11/1984 | McCubbrey | 382/49 |
| 4,541,048 | 9/1985 | Propster et al. | 364/200 |
| 4,611,305 | 9/1986 | Iwase | 364/736 |
| 4,627,026 | 12/1986 | Givgno | 364/900 |

OTHER PUBLICATIONS

TRW Product Preliminary Information Specification—TDC1028 Revision B-2/84.

*Primary Examiner*—David H. Malzahn
*Attorney, Agent, or Firm*—Bernard J. Lacomis; James C. Davis, Jr.

[57] ABSTRACT

Method and apparatus are provided for performing a plurality of digital signal processing functions wherein each said function is a unique combination of identical subfunctions. A plurality of operating units are provided wherein each operating unit is adapted to perform one said subfunction. Apparatus and method are disclosed for programmably configuring these operating units in a variety of serial combinations wherein each combination will perform a respective signal processing function.

7 Claims, 6 Drawing Figures

VLSI PROGRAMMABLE DIGITAL SIGNAL PROCESSOR

BACKGROUND OF THE INVENTION

The present invention is directed in general toward apparatus and method for performing signal processing functions and, more particularly, toward apparatus and method programmable to perform a variety of signal processing functions.

There is an ever increasing need to perform a multiplicity of digital signal processing functions, e.g. finite impulse response filtering, infinite impulse response filtering, convolution, correlation, etc. These functions are characterized by the need to perform a plurality of identical subfunctions on a sequence of digital data wherein each function is a unique combination of these identical subfunctions. For example, to implement an nth order finite impulse response filter, where the filtered result y is equal to a summation of the products of a series of digital data input, one must implement the equation:

$$y_k = a_0 x_k + a_1 x_{k-1} + a_2 x_{k-2} + \ldots + a_n x_{k-n}.$$

The expression comprises a serial combination of subfunctions wherein the subfunction comprises one multiplication and one addition.

With the continuing application of digital signal processing functions to physical devices, such as image reconstruction, these functions are required to be performed at higher and higher rates of speed. The present invention provides apparatus and method for implementing such functions in a manner such that a series of concurrent multiplications and additions can be performed to provide a sequence of filtered data output.

Prior art systems for processing digital information have relied primarily upon a central processing unit coupled to a plurality of digital data storage elements for performing a plurality of sequential digital operations upon digital data under program control. Many of these operations involve multiple transfers of digital data to and from memory in addition to performing the necessary arithmetic operations.

For example, to perform a finite impulse response filtering, like that described above, a traditional data processing device would be required to: retrieve $a_0$ $x_k$ from their respective memory locations; multiply $a_0$ and $x_k$ to form a first product; store this product in a partial sum memory location; retrieve $a_1$ and $x_{k-1}$ from their respective memory locations; multiply $a_1$ and $x_{k-1}$ to form a second product; retrieve the partial sum from its memory location; add the partial sum to the second product to form a new partial sum; and store the new partial sum in the partial sum memory location etc., until each of the n operands have been multiplied and summed. Such operations require complex programming and, more importantly, are extremely time-consuming.

Newer devices for performing digital signal processing functions provide apparatus for performing successive operations, however, such devices do not allow for programmability and therefore are highly function specific. One such device is shown and described in U.S. Pat. No. 4,142,242 to Duvochel et al. (1979).

It is desirable, therefore, to provide apparatus to perform a variety of digital signal processing functions. It is also desirable to provide apparatus to perform digital signal processing functions without the need to continuously store and retrieve data from memory. It is also desirable to provide apparatus to perform rapid digital signal processing functions on a series of input data to provide a series of output data.

OBJECTS OF THE INVENTION

It is therefore a principal object of the present invention to provide programmable apparatus for performing a variety of digital signal processing functions.

It is a further object of the invention to provide apparatus to perform concurrent and sequential digital signal processing functions.

It is still another object of the invention to provide a method for performing a variety of concurrent and sequential digital signal processing functions.

SUMAMRY OF THE INVENTION

These and other objects of the invention are met by providing a user configurable VLSI semiconductor circuit for receiving a sequence of input data from at least one data source and for performing a succession of concurrent subfunctions on the input data to provide a sequence of output data to a data destination.

A plurality of operating units are provided wherein each operating unit is adapted to perform the subfunction. A configuration register and a multiplexer/demultiplexer are provided to allow a user of the circuit to configure the operating units in a variety of combinations wherein each combination performs a different signal processing function.

A delay unit is supplied for providing a delay between the output of one operating unit and the input to another. A truncator is also supplied for truncating the output of any operating unit. A controller is coupled to each operating unit, the delay and the truncator for providing signals to synchronize the overall operating of the semiconductor chip.

BRIEF DESCRIPTION OF THE DRAWINGS

The subject matter regarded to be invention is particularly pointed out in the claims appended hereto. However, the invention itself, both as to organization and method of practice, can best be understood from a reading of the Detailed Description of the Drawings in which:

DETAILED DESCRIPTION OF THE DRAWINGS

As mentioned hereinabove, there exists a need to provide apparatus for performing a variety of digital signal processing functions. The present invention meets this need by providing a user configurable VLSI semiconductor circuit for performing a multiplicity of identical, successive and concurrent digital operations. The circuit includes a plurality of data paths for transferring a sequence of input data to the semiconductor circuit from a chip input, for transferring data between devices located on the chip and for transferring data to a chip output from the semiconductor circuit. A multiplicity of digital processing units (DPUs) are provided wherein each unit comprises: an operating unit, each for performing an identical subfunction on a sequence of input operands; a multiplexer/demultiplexer for programmably coupling the operating units to several of the aforementioned data paths in response to configuration control signals provided by a user of the circuit; and a configuration register for receiving the configuration control signals from the user and coupling them to the multiplexer/demultiplexer.

Figure 1:
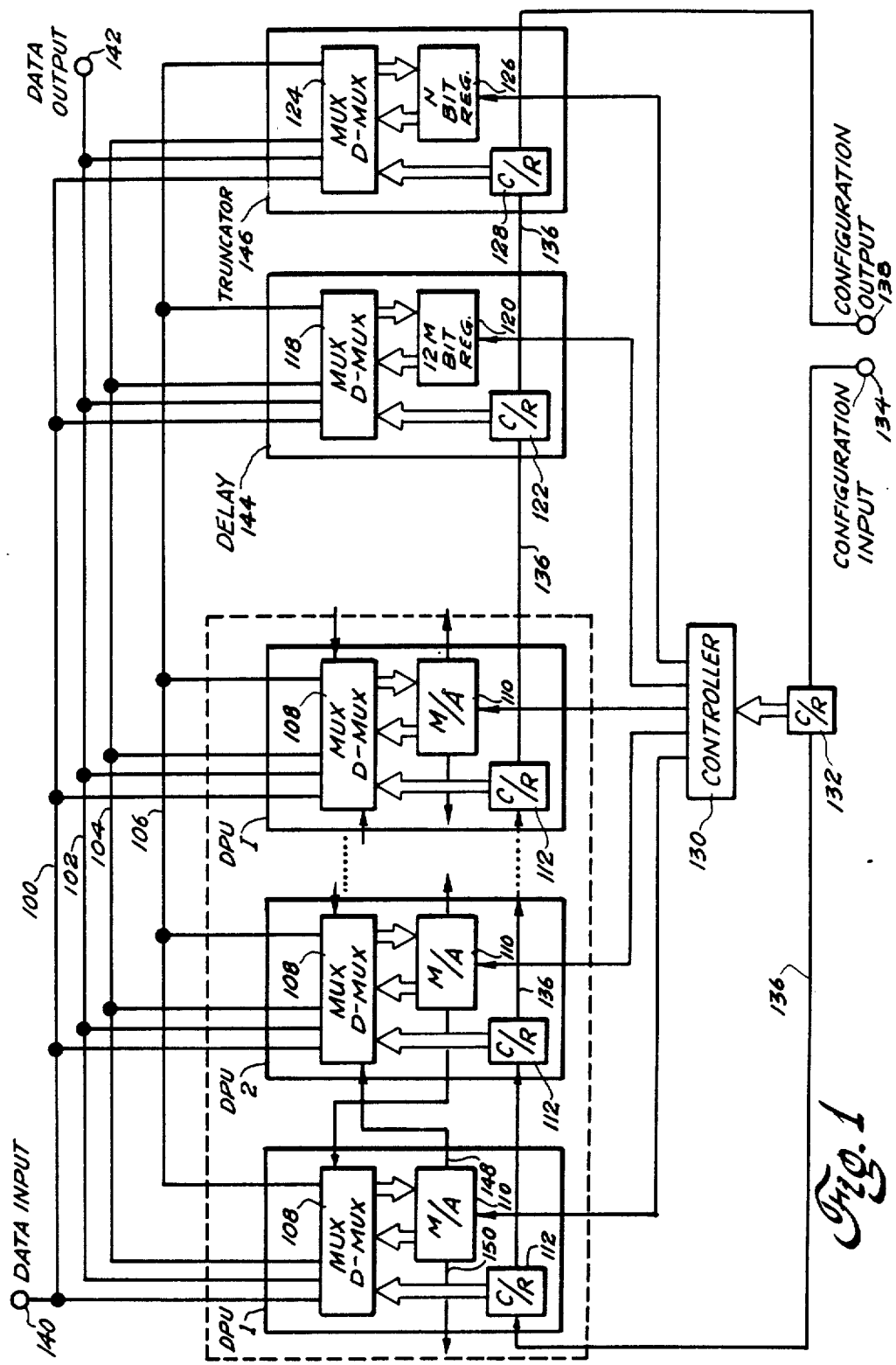
FIG. 1 is an illustrative block diagram of the circuit for carrying out the present invention.

As shown in FIG. 1, there is provided a plurality of serial data paths 100, 102, 104, and 106 each coupled to the DPUs 1-I, the delay 144 and the truncator 146. It will be understood that while only four data paths are shown, a plurality of data paths are actually provided. Several data paths, such as path 100, are coupled to a chip input 140 for providing data to the circuit from a data source. Likewise, several data paths, such as data path 102, are coupled to a chip output 142 for providing data to a data destination from the circuit. Other data paths, such as path 104, are not coupled either to a chip input or a chip output but instead are intended only to transfer data among devices located on the VLSI semiconductor chip.

It will be noted that the optimum number of data paths which must be provided to allow maximum configuration flexibility will be dependent upon the number of DPUs located on the chip. Further, while it would be desirable to couple each data path to either a chip input or a chip output, this would be impractical as the number of chip inputs is limited. However, maximum configuration flexibility can be maintained by providing several recirculation paths for transferring data between DPUs. The optimum ratio of recirculation data paths to the total number of data paths will again be determined by the number of DPUs located on the chip as well as the intended uses, or configurations, of the chip.

In the preferred embodiment, there are four input data paths 100 a-d, four output data paths 102 a-d and two recirculation data paths 104 and 106. It will be noted that while only two recirculation data paths are provided, data can also be transferred among DPUs using either an input data path or an output data path.

A plurality of DPUs 1-I are provided each including a multiplexer/demultiplexer 108 for selectively routing data to and from an operating unit 110 in response to configuration control signals received from a configuration register 112. In the preferred embodiment, each operating unit comprises a multiplier/adder adapted to perform a multiplication and addition on its input data. It will be appreciated by those skilled in the art that while operating units of the present invention are shown and described as multiplier/adders, these units may comprise any subfunction which can be combined in a variety of configurations, each to perform a different signal processing function.

Multiplexer/demultiplexer 108 may comprise any known device capable of coupling a select few of the plurality of data paths to multiplier/adder 110 in response to configuration control signals received from configuration register 112. For convenience, multiplexer/demultiplexer 108 is shown as one unit in FIG. 1, however, multiplexer/demultiplexer 108 may actually comprise a plurality of units each coupled to configuration register 112 for receiving its appropriate configuration control signals and each adapted to either couple one input to multiplier/adder 110, or to couple one output from multiplier/adder 110, to a select few of the aforementioned data paths. Similary, while each multiplexer/demultiplexer 108 of each DPU 1-I is shown as a discrete element from each remaining multiplexer/demultiplexer 108, they may actually comprise one unit wherein that one unit is adapted to receive information from data paths 100-106 and selectively route data to each multiplier/adder 110 of each DPU 1-I.

Each DPU 1-I is capable of receiving at least one sequence of data from either of the aforementioned data paths, routing this data to multiplier/adder 110 via multiplexer/demultiplexer 108 such that a serial multiplication and addition can be performed to provide a sequence of DPU output data and, thereafter, routing this data from multiplier/adder 110 to either of the remaining data paths via multiplexer/demultiplexer 108.

Each configuration register 112 of DPUs 1-I is coupled to its respective multiplexer/demultiplexer 108 for the parallel transfer of configuration control signals thereto. Each configuration register 112 of each DPU is also shown serially coupled to a chip input 134 and a chip output 138 via the remaining configuration registers for receiving a serial sequence of configuration control data from the user, as discussed more fully hereinbelow. Each configuration register 112 comprises a multibit shift register wherein each bit is coupled to a control bit of the multiplexer/demultiplexer. By selecting the appropriate sequence of configuration control data to be shifted into configuration register 112, a user can control the operation of multiplexer/demultiplexer 108 to selectively route data between the aforementioned data paths and the appropriate inputs and outputs of multiplier/adder 110.

For example, where the appropriate configuration control signals are provided to configuration register 112 from a user of the chip, multiplexer/demultiplexer 108 of DPU 1 could couple data paths 100a and 100b to the input of its multiplier/adder 110 and couple the output of its multiplier/adder 110 to data path 104. Further, DPU 2 could couple one of the inputs to its multiplier/adder to data path 104 and, thereby, could provide as one of its inputs the output from the multiplier/adder of DPU 1.

Further, each multiplier/adder 110 of each DPU 1-I includes two outputs 148 and 150 which are coupled directly to the multiplexer/demultiplexer of its physical neighbor on the chip. Thus, data can be transferred from any multiplier/adder to the multiplier/adder of it's adjoining DPU without the need to first transfer this data to any of the data paths 100-106.

A delay 144 comprises a multiplexer/demultiplexer 118 programmably coupled to each of the aforementioned data paths for routing data to and from a delay register 120 in response to configuration control signals from configuration register 122. The delay unit is included for providing an M word delay between the output of a first data processing unit and the input to a second data processing unit. Hence, where the data word is 12 bits, delay register 120 comprises simply a 12 M bit shift register with one serial input and M serial outputs, one output every 12 bits. By choosing either of the M outputs, a variable word delay can be provided. It will be appreciated by those skilled in the art that while the invention is described herein for use with 12 bit words, the circuit could be adapted for use with words of any bit length with only minor modifications.

Thus, in the example above, where a 4 word delay is desired between the output of multiplier/adder 110 of DPU 1 and the input of multiplier/adder 110 of DPU 2, configuration control signals provided to configuration register 122 from a user would cause multiplexer/demultiplexer 118 to couple the input of delay register 120 to data path 104. The 4th word output of delay register 120 may be coupled to either of the remaining data paths, e.g. data path 106. Instead of the input to multiplier/adder 110 fo DPU 2 coming from data path 104, configuration control signals provided to configuration register 112 of DPU 2 would instruct multiplexer/demultiplexer 108 of DPU 2 to couple the input of multiplier/adder 110 to data path 106 thereby providing a 4 word delay between the output of DPU 1 and the input of DPU 2.

A truncator 146 comprises a multiplexer/demultiplexer 124 coupled to each of the aforementioned data paths for selectively routing data to and from a truncation register 126 in response to configuration control signals received from a configuration register 128. The truncator is provided to allow the user to truncate output data from either of the DPUs. Hence, truncation register 126 comprises a 12 bit register with one input and one output wherein any 12 of the output bits from the DPUs can be selected by shifting the subject DPU output data through the register until all of the 12 desired bits are located in the register and disabling shifting of any further bits until the end of the DPU output sequence. At that time, a 12 bit truncated output will be stored in truncation register 126.

Further, truncator 146 cooperates with a controller 130 to provide a jam set function as is known in the art. Thus, if the 12 selected bits are not within the range of meaningful data, e.g. if the register overflows, controller 130 will jam set register 126 to its maximum or minimum, positive or negative value to more accurately represent the actual data value.

Controller 130 is provided to synchronize the operation of each of the DPUs, the delay unit, and the truncator. Controller 130 receives configuration data from a user of the chip via configuration register 132 to allow user programmability of several synchronization signals.

With respect to the delay unit, controller 130 provides a synchronous clock signal to the delay register 120 such that data is continuosly shifted therethrough.

With respect to the truncator, the controller provides a synchronous clock which is enabled until the period where the 12 desired bits are located in the register and disabled for the remainder of the DPU output. The period during which the truncation register is enabled, and hence the part of the DPU output which will be truncated, is programmable from a user by providing the appropriate configuration signals to the controller configuration register 132.

With respect to the DPUs, controller 130 provides signals to synchronize the loading of inputs, the multiplication and the addition as described more fully hereinbelow.

In the preferred embodiment, controller 130 comprises an array of logic elements known in the art as a logic array. This array may be adapted to provide any specified output as a function of its input. Adapting the array to provide the desired outputs in response to given inputs, may be accomplished by any of a variety of methods well known throughout the art. While the controller is shown in the preferred embodiment as one unit separate from the DPUs, it will be appreciated by those skilled in the art that it may comprise a plurality of units each integrated with a respective DPU.

The controller configuration register 132 is coupled to each configuration register 112 of each DPU 1-I, to configuration register 122 of the delay unit and to configuration register 128 of the truncator for loading the configuration control signals from a chip input 134 via a configuration loop 136. Configuration loop 136 serially couples each configuration register in a closed loop such that data entered on chip input 134 will eventually be shifted to truncation configuration register 128, delay configuration register 122, each DPU configuration register 112 and controller configuration register 132.

The configuration data is entered by a user prior to entering any input data, thereby providing a configuration which is fixed during operation of the circuit. For a user of the chip to configure the circuit in a particular manner, configuration control data would be provided to chip input 134 with the configuration control data for truncation configuration register 128 entered first, the configuration control data for delay configuration register 122 entered second, configuration control data for configuration register 112 of the last DPU I entered third, and so on, with the configuration control data for the control configuration register 132 entered last. It will be appreciated by those skilled in the art, that by entering several test bits prior to entering the configuration data for truncation configuration register 128, the test data may be shifted to chip output 138 at the end of the configuration loading cycle such that this data can be examined by the user to insure continuity of configuration data loop 136.

By entering the proper configuration data to each of the aforementioned configuration registers, a user of the circuit determines the configuration of the circuit, i.e. the data path from which each DPU will receive its inputs, and also determines to which data path each DPU will provide its output. By coupling the output of any DPU to the input of any succeeding DPU, a user can cascade DPUs to provide a circuit for performing successive multiplications and additions, e.g. $\Sigma a_n x_{k-n}$ for $n=0$ to $N-1$, upon a sequence of input data. Further, because each DPU contains its own multiplier/adder acting in synchronism with the remaining multiplier/adders, a succession of functions may be performed concurrently on a sequence of input data, as described more fully herein with respect to FIG. 5.

Figure 2:
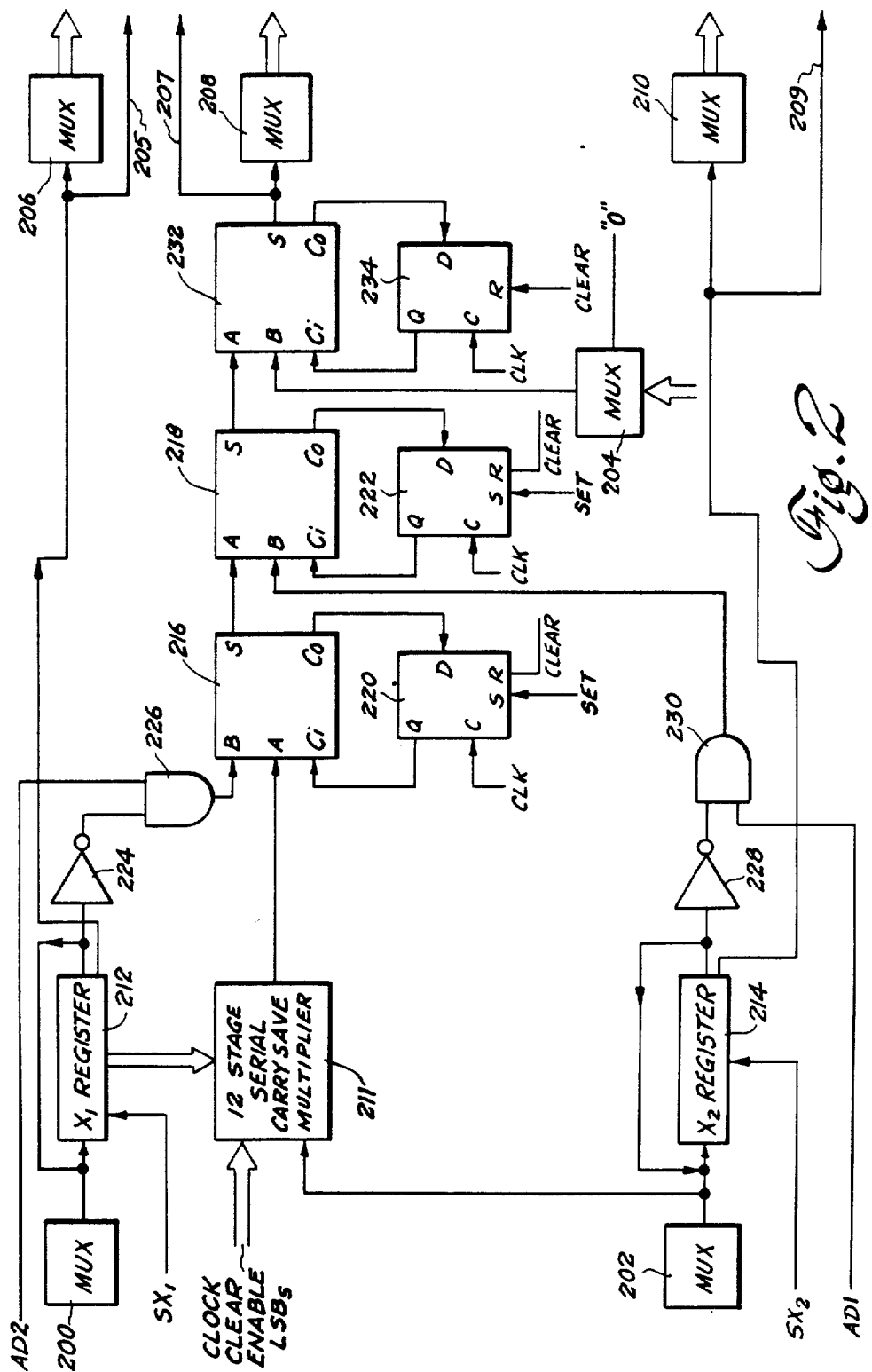
FIG. 2 is a more detailed block diagram of the operating units which comprise the data processing units.

A more detailed diagram of each multiplier/adder 110 can be found in FIG. 2. Therein, multiplexer/demultiplexer 108 (FIG. 1) is shown to comprise a plurality of multiplexers 200, 202, and 204 and a plurality of demultiplexers 206, 208 and 210. For convenience, multiplexers 200, 202, and 204 and demultiplexers 206, 208, and 210 are not shown coupled to configuration register 112. However, it will be appreciated that each multiplexer and each demultiplexer receives its appropriate configuration control signals from configuration register 112 as described hereinabove with reference to FIG. 1.

Outputs 205, 207 and 209 are not coupled to the demultiplexers as these are coupled directly to the multiplexers of each adjacent muliplier adder as described with reference to FIG. 1. While only one connection is shown between adjacent multipler/adders of FIG. 1, to wit, 148 and 150, it will be understood that each connection 148 and 150 to the multiplexer/demultiplexer of adjacent BIUs in FIG. 1 actually comprises three outputs 205, 207 and 209 shown in FIG. 2.

The multiplier/adder itself is shown to comprise a 12 stage serial, carry save multiplier 211 coupled to receive parallel data from a data register 212 and serial data as it is shifted into a data register 214. Registers 212 and 214 are each coupled to receive data from select ones of the aforementioned data paths via their respective multiplexers 200 and 202. Registers 212 and 214 may serve the dual functions of providing a one word delay as well as providing a means to temporarily store operands $X_1$ and $X_2$ for use later in the circuit. Registers 212 and 214 may comprise multibit shift registers for receiving the multiplication operands provided to multiplier 211. As shown in the Figure, register 212 is adapted to receive operand $X_1$ while register 214 is adapted to receive operand $X_2$.

Figure 3:
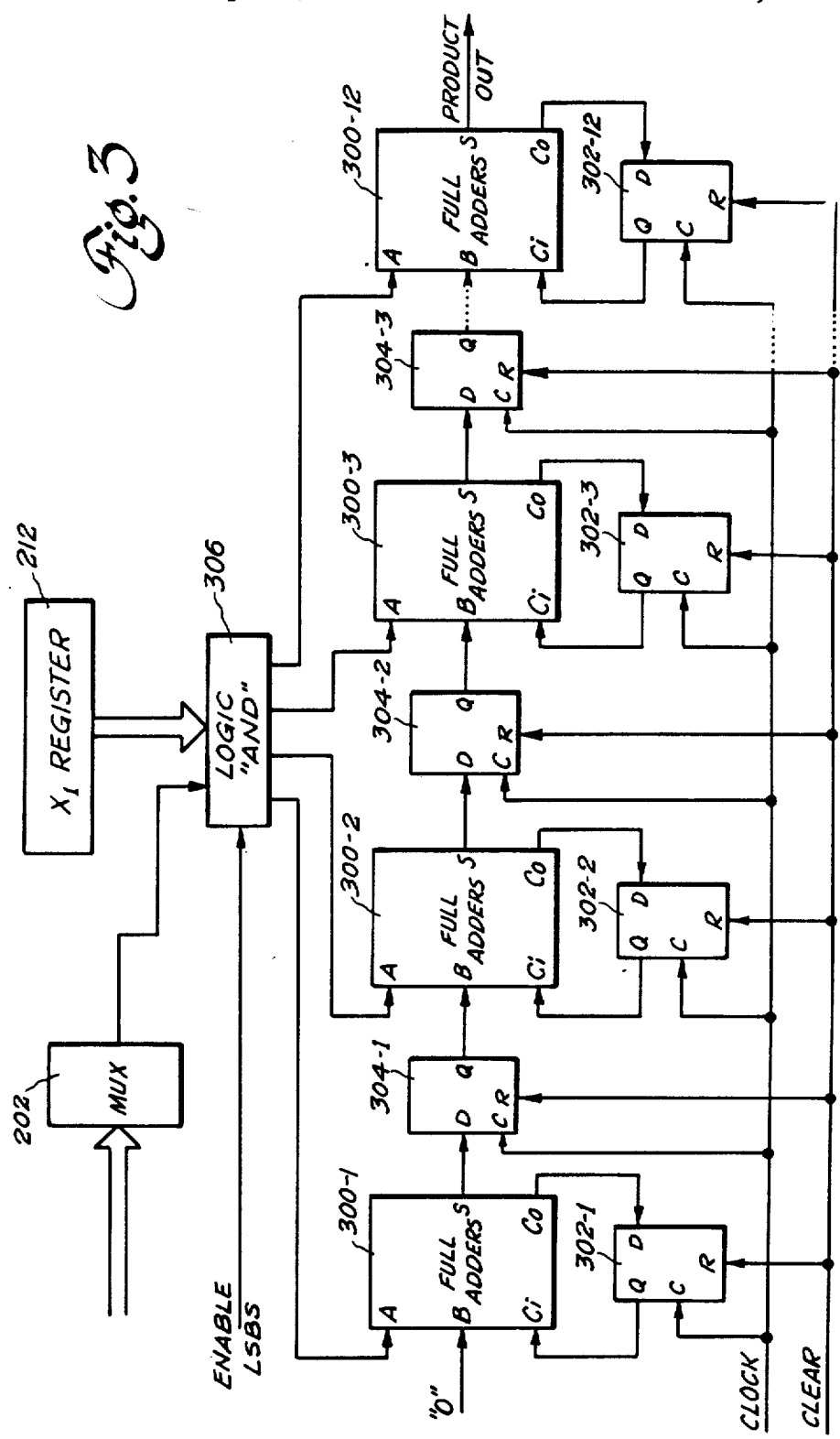
FIG. 3 is a block diagram of a 12 stage carry save serial multiplier such as that used in the present invention.

Multiplier 211 comprises a 12 stage serial, carry save multiplier adapted to provide a 24 bit product from the multiplication of two 12 bit operands $X_1$ and $X_2$. The product is shifted out of multiplier 211 with the least significant bits being shifted first and the most significant bits being shifted last. Detailed operation of carry save multiplier 211 can be provided by reference to FIG. 3 wherein a more detailed diagram of the multiplier is provided. Therein, multiplier 211 is shown to comprise 12 full adders 300, each including two addend inputs A and B, a carry input $C_i$, a sum output S and a carry output $C_o$. The carry output of each full adder 300 is fed back to its carry input via a carry flip-flop 302. The sum output of each full adder 300 is coupled to the B addend input of the following stage via a sum flip-flop 304. Register 212 and multiplexer 202 (see also FIG. 2) are shown coupled to each full adder via a plurality of logic AND gates 306.

For multiplication of two 12 bit data words $X_1$ and $X_2$, 12 logic AND gates 306 would be provided each coupled to receive a respective one of the 12 bits of operand $X_1$ stored in register 212. Each AND gate would also be coupled to receive one and the same bit of operand $X_2$. Logic AND gates 306 thereby enable the parallel transfer of the 12 bit operand $X_1$ from register 212 to full adders 300 where the received $X_2$ bit is a logic one and inhibit the parallel transfer of the $X_1$ operand where the $X_2$ bit is a logic zero. Each output from AND gates 306 is coupled to a respective addend input A of the full adders 300, with the most significant bit of operand $X_1$ being coupled to the first sage 300-1 and the least significant bit of operand $X_1$ being coupled to the last stage 300-12.

An enable least significant bits (LSBs) control signal is provided from controller 130 (FIG. 1) to enable operation of logic AND gates 306. The enable LSBs control is active to allow operation of AND gates 306 only during the first 12 bits of multiplication, i.e. while providing the 12 least significant product bits. Thereafter, the enable LSBs control is inactivated thereby preventing operation of AND gates 306 such that each AND gate output is a logic zero regardless of the AND gate inputs.

A clock signal is provided from control 130 to carry flip-flops 302 and sum flip-flops 304 to provide synchronous operation of the multiplier. A clear signal is also provided from controller 120 to each carry flip-flop 302 and to each sum flip-flop 302 to reset the multiplier before each multiplication operation.

In operation, all twelve bits of operand $X_1$ are loaded in register 212 and the multiplier is cleared by controller 130 such that the multiplication operation can begin. Operand $X_2$ is shifted into register 214 (FIG. 2) bit by bit shifting the least significant bit first. As these bits are shifted into register 214, they are used to either enable or inhibit passage of the 12 bit operand $X_1$ through logic AND gates 306 as described above. Each full adder produces a sum and a carry output depending upon the state of the addend inputs A and B, and the state of the carry input $C_i$.

As is known in the art, carry save multipliers work from clock cycle to clock cycle where the carry produced in one cycle is fed back to the same stage in the next cycle and the sum produced in one cycle is fed forward to the following stage in the next cycle. These operations are accomplished in the subject invention via carry flip-flops 302 and sum flip-flops 304. During each cycle, each full adder stage 300 of the multiplier adds the input from logic AND gate 306 to the sum of the preceding stage for the preceding cycle via sum flip-flop 304, and its own carry from the preceding period via carry flip-flop 302. The exception to this being the first stage 300-1. Because there is no stage preceding stage 300-1, the B input of full adder 300-1 is grounded, thus adding logic zero to the most significant bit of operand $X_1$ and the carry from full adder 300-1.

As the clock cycles progress, the 12 least significant bits are serially shifted out of the last stage of the multiplier. Thereafter, logic AND gates 306 are disabled by the controller via the enable LSBs control signal. At this point, the algorithm of FIG. 5 is performed as described below such that the sign correction function can be initiated. The operation of the full adders continues for 12 more clock cycles to serially produce the most significant bits of the product.

The signed product is corrected by subtracting operand $X_1$ from the most significant bits of the product if the sign of operand $X_2$ is negative and subtracting operand $X_2$ from the most significant bits of the product if the sign of operand $X_1$ is negative. This is accomplished in the circuit of FIG. 2 via full adders 216 and 218.

Therein, full adders 216 and 218 are shown to include two addend inputs A and B, a carry input $C_i$, a sum output S and a carry output $C_o$. The carry output of full adders 216 and 218 is coupled to their carry inputs via carry flip-flops 220 and 222. Operand $X_1$ is coupled to the B input of adder 216 via inverter 224 and AND gate 226 such that this operand can be subtracted from the most significant bits of the multiplier product in adder 216 if the sign of operand $X_2$ is negative. Likewise, operand $X_2$ is coupled to the B addend input of adder 218 via inverter 228 and AND gate 230 such that this operand may be subtracted from the most significant bits of the product in adder 218 if the sign of operand $X_1$ is negative.

Two's complement subtraction of operand $X_1$ and/or operand $X_2$ is accomplished by first inverting the digits via inverters 224 and 228, respectively, and adding one by setting carry flip-flops 220 and 222. Since the least significant ones of the 12 most significant bits are shifted out of multiplier 211 first, both operands $X_1$ and $X_2$ are shifted from registers 212 and 214, respectively, in similar order, i.e. the least significant bits are shifted out first. It will be noted that the output of registers 212 and 214 are coupled to their respective inputs such that the data can be restored during the last 12 bits of multiplication, concurrently with the bit by bit subtraction of the subject operand, such that the operands $X_1$ and $X_2$ will be available in their respective registers at the conclusion of the multiplication cycle.

Figure 4:
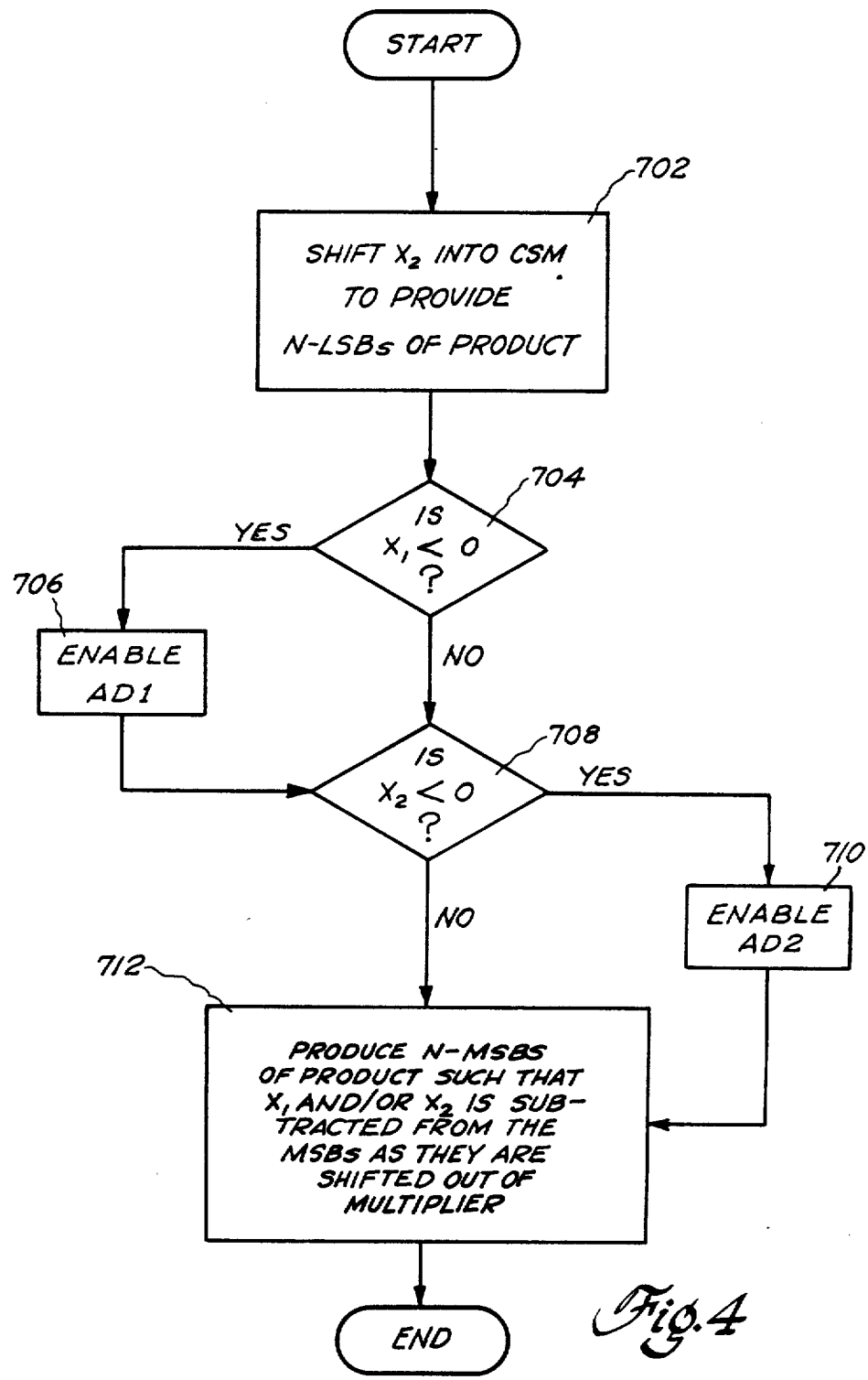
FIG. 4 is a decisional flow diagram of the method of operating the apparatus illustrated in FIG. 2.

The operation of adders 216 and 218 may best be described by reference to the decisional flow diagram of FIG. 4. Operand $X_2$ is shifted into carry save multiplier 211 to produce the 12 least significant bits of the product, step 701, as described above. During this step, control signals AD1 and AD2 (FIG. 2) are not enabled such that neither operand $X_1$ nor operand $X_2$ is received by adders 216 or 218 and the least significant bits are passed through these adders without alteration, i.e. the B input is zero and the sum output is equal to the identity function.

After the 12 least significant bits are produced, the sign of operand $X_1$ is examined, step 704. If it is negative, i.e. $X_1$ is less than zero, control signal AD1 is enabled, step 706, and carry flip flop 222 is set, thereby allowing operand $X_2$ to be subtracted from the most significant bits of the product as they are shifted out of multiplier 211. Similarly, the sign of operand $X_2$ is examined, step 708, and if it is negative control signal AD2 is enabled, step 710, and carry flip flop 220 is set, thereby allowing operand $X_1$ to be subtracted from the 12 most significant bits of the product as they are serially shifted from multiplier 211.

After the signs of each operand $X_1$ and $X_2$ are examined, and the appropriate ones of control signals AD1 and/or AD2 enabled, the 12 most significant bits of the product are produced, step 712, and either operand $X_1$ and/or $X_2$ is subtracted from these bits as they are shifted out of multiplier 211.

In addition to performing a twos compliment multiplication on two input operands, each multiplier/adder is capable of adding its multiplier product to a third operand via a full adder 232, FIG. 2. Adder 232 is shown with its addend input A coupled to receive the sign corrected product output from adder 218. The carry output $C_o$ of adder 232 is coupled to its carry input $C_i$ via carry flip-flop 234. Addend input B is coupled to receive the third operand from either of the aforementioned serial data paths via multiplexer 204. Further, each adder is capable of receiving a logical zero input via multiplexer 204. Thus, each DPU is capable of multiplying two 12 bit operands to provide a 24 bit sign corrected product, and to add this product to a third addend input to provide the DPU output Processed output from the multiplier/adder is coupled to multiplexer 208 such that it may be coupled to either of the aforementioned data paths. likewise, the output from register 212 is coupled to multiplexer 206 and the output from register 214 is coupled to multiplexer 210 such that they may be coupled to either of the aforementioned data paths. In this regard, registers 212 and 214 are coupled to receive respective shift control signals $SX_1$ and $SX_2$ from controller 130 to control their shifting operation. This signal not only controls when these registers shift data but also whether it is shifted to inverters 224 and 228 or demultiplexers 206 and 210.

Control data is provided by controller 130 for controlling the synchronization of each multiplier/adder and for controlling the operation of the data registers associated therewith as described above. Instructions for a multiplication and addition cycle are permanently loaded in controller 130 such that each multiplier/adder performs a multiplication and addition function in synchronism with each of the remaining multiplier/adders.

Thus, controller 130 is adapted to provide the control signals described above with reference to FIGS. 2-4 in response to minimal programming from the user of the circuit. That control data which is provided from the user (e.g. to instruct the registers of the multiplier/adders either to load new data or to maintain the same data, the number of bits for sign extension and the bits for truncation) is loaded into controller configuration register 132 via control loop 136 in the same manner as configuraton data is loaded into each of the remaining configuration registers.

Figure 5A:
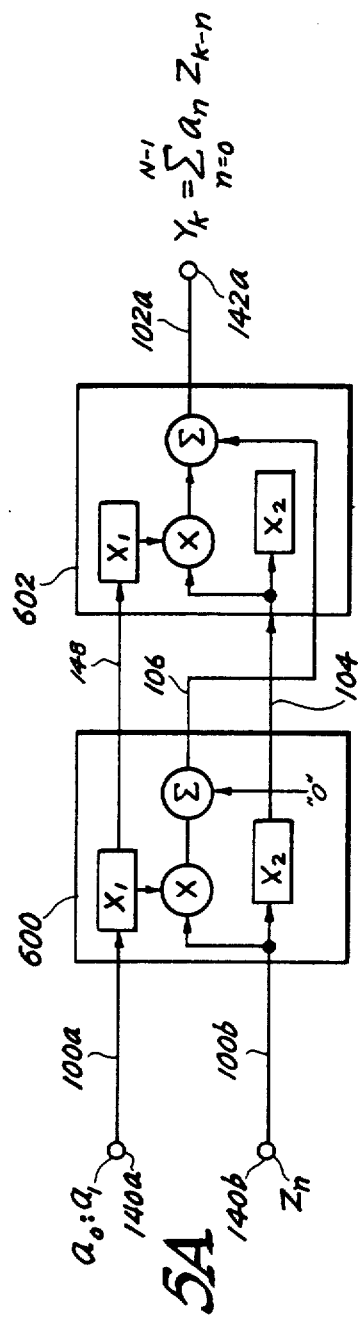
FIGS. 5A and 5B contain two exemplary configurations.
Figure 5B:
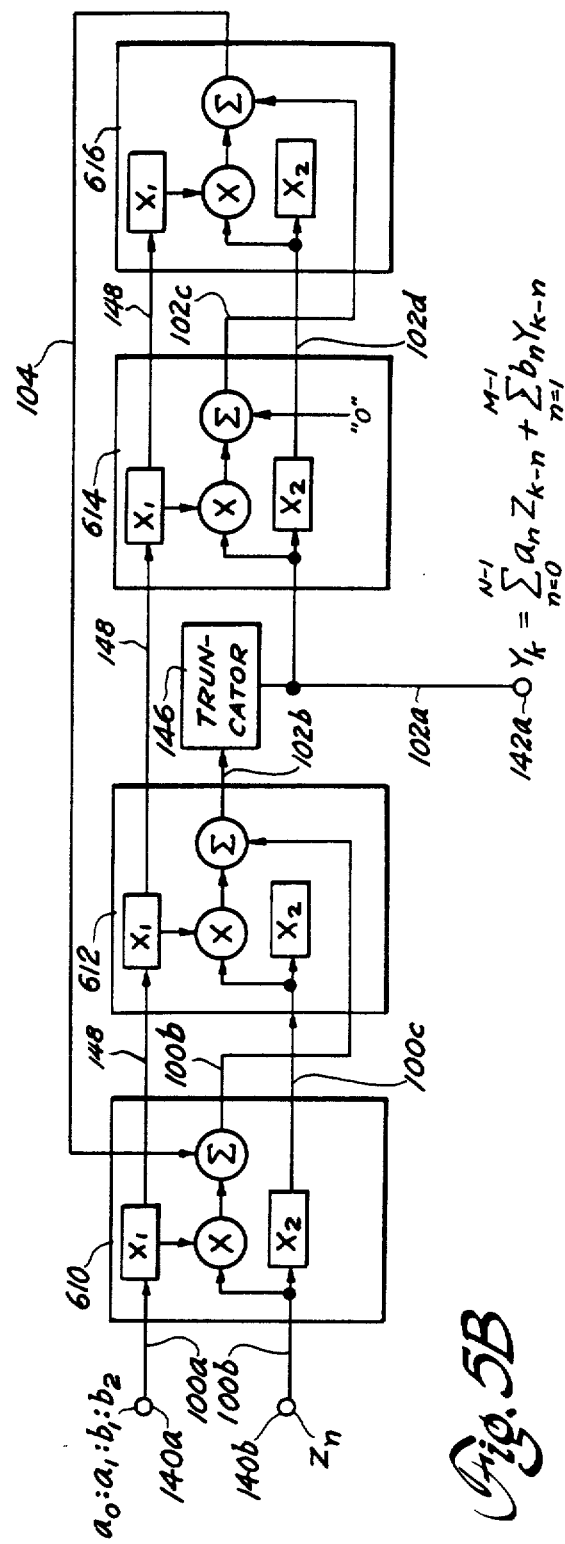

With reference to FIGS. 5A and 5B, there is shown two examples of configurations to perform finite impulse response filtering and infinite impulse response filtering, respectively. FIG. 5A shows a configuration to solve for the equation $Y_k = \Sigma a_n Z_{k-n}$, for $n=0$ to $N-1$. Where $N=2$, the sequential output $Y_k$ would be given by the following equations:

$$Y_0 = a_0 Z_0$$

$$Y_1 = a_0 Z_1 + a_1 Z_0$$

$$Y_2 = a_0 Z_2 + a_1 Z_1$$

$$Y_3 = a_0 Z_3 + a_1 Z_2 \text{ etc.}$$

This function requires the use of two multiplier/adders 600 and 602. Initially, variables $a_0$ and $a_1$ must be loaded into either the $X_1$ or $X_2$ register. This is accomplished by configuring the circuit for loading the constant variables only, loading the constant variables and then reconfiguring the circuit for performing the multiplication.

As shown in FIG. 5A, constants $a_1$ and $a_0$ are entered into multiplier/adders 602 and 600, respectively, via a chip input 140a and input data path 100a. Register $X_1$ of multiplier adder 600 is coupled to register $X_1$ of multiplier/adder 602 via a data path 148. In the example given, data path 148 is that which couples multiplier/adder 600 to its immediate physical neighbor on the chip. As noted above, using the immediate neighbor connection eliminates the need of using an input, output, or recirculation data path.

After the circuit has been provided with constants $a_0$ and $a_1$, the circuit is reconfigured to perform the finite impulse response filtering.

As further shown in the Figure, the circuit is configured to receive variables $Z_0 - Z_k$ into the $X_2$ registers of multiplier/adders 600 and 602 via a chip input 140b and input data path 100b. Register $X_2$ of multiplier/adder 600 is coupled to register $X_2$ of multiplier/adder 602 via recirculation data path 104. The adder of multiplier/adder 600 is coupled to receive a logical zero input in addition to the product input from the multiplier. The adder of multiplier/adder 602 is coupled to receive the output from multiplier/adder 600 via recirculation data path 106. The sum output of multiplier/adder 602, which also comprises the output from the circuit, is provided to a user of the circuit via a chip output 142a and output data path 102a.

In addition to configuring the circuit as described above, signals are provided to the controller to instruct it not to shift the constants $a_0$ and $a_1$ at the conclusion of any multiplication cycle. The filtering may now begin.

Both multiplier/adders are initialized at zero, i.e. all registers with the exception of registers $X_1$ of multiplier/adders 600 and 602 contain a logic zero. After the first clock cycle, multiplier/adder 600 will begin providing the product output of the first variable $Z_0$ and constant variable $a_0$. The output from register $X_2$ of multiplier/adder 600, and therefore the input to register $X_2$ of multiplier/adder 602, will be zero and will continue to be zero through the first 12 clock cycles, at which time the first variable $Z_0$ is fully contained within register $X_2$ of multiplier/adder 600.

During the next 12 clock periods, the contents of both registers $X_1$ and $X_2$ of both multiplier/adders 600 and 602 are recirculated such that the sign correction of the multiplied product can be performed as shown and described with reference to FIG. 2. During this period, the contents of each register are recirculated instead of being transferred to another part of the circuit via that register's multiplexer. At the end of this second 12 clock cycles, the first 24 bit output $Y_0$, equal to $a_0Z_0$, will have been provided to chip output 142a. During the next 24 clock cycles, the value of $Z_0$ will be transferred to multiplier/adder 602 as the value of $Z_1$ is read into multiplier/adder 600 and each multiplier/adder 600 and 602 will begin to provide their product output. The circuit output delivered to chip output 142a via data path 102a during the second 24 clock cycles will be the second Y value $Y_1$ and will be given by the expression:

$$Y_1 = a_0Z_1 + a_1Z_0.$$

This filtering will continue in similar manner for all Z values entered and will provide a continuous stream of Y value output.

An example for an infinite finite response filter is shown in FIG. 5B. Like the example of FIG. 5A, constants $b_2$, $b_1$, $a_1$ and $a_0$ are entered into the $X_1$ registers via a chip input 140a and data path 100a wherein each $X_1$ register is coupled to the successive $X_1$ register via its next neighbor connection 148. Also, the filter input $Z_n$ is entered via a chip input 140b and data path 100b. However, instead of the adder input of the first multiplier/adder receiving a logical zero, it is coupled to receive feedback from another part of the circuit, that being the output of multiplier/adder 616, via a recirculation data path 104. The $X_2$ register of multiplier/adder 610 is coupled to the $X_2$ register of multiplier/adder 612 via an input data path 100c. It will be noted, as mentioned above that input data paths, as well as output data paths, may be used to transfer data between the multiplier/adders as well as to perform their respective function of providing input or output data.

The output from multiplier/adder 610 is coupled to the adder input of multiplier/adder 612 via the remaining input bus 100b. The output of multiplier/adder 612 is coupled to the output chip 142a via output data path 102a, truncator 146 and output data path 102b. The output provided to chip output 142a is also provided to the $X_2$ register of multiplier/adder 614 by coupling this register to the output data path 102a. It is noted, that the output from multiplier/adder 612 must be truncated before being provided as input to either register $X_1$ or register $X_2$ as the output from any multiplier/adder is a 24 bit data word while the registers $X_1$ and $X_2$ are only adapted to receive 12 bit data words.

The adder of multiplier/adder 614 is coupled to its logical zero input. The output of multiplier/adder 614 is coupled to the adder input of multiplier/adder 616 via output data path 102c. The output from register $X_2$ of multiplier/adder 614 is coupled to the input of register $X_2$ of multiplier/adder 616 via output data path 102d.

When configured in this manner, the circuit of FIG. 5b provides the output $Y_k$ given by the function:

$$Y_k = \Sigma a_n Z_{k-n} + \Sigma b_m Y_{k-m};$$

for $a = 1$ to $N-1$ and $m = 1$ to $M-1$.

It is possible on a chip containing six digital processing units 100 to configure three of the digital processing units to perform finite impulse response filtering from a series of data supplied to the chip from a data source via an input pin of the chip and provide the output thereof to a data destination via an output pin of the chip. Further, two of the remaining three digital processing units could be configured to provide an inner product operation from the data received from a data source and provide the product to a data destination. The last of the digital operating units could remain idle, or alternatively, could be configured to perform a simple multiplication or a simple addition of either the result of the finite impulse response and inner product calculation or could provide multiplication and/or addition of a series of variables from off the chip.

Thus has been described and disclosed, a programmable digital processing unit for performing a multiplicity of digital data processing functions. While the above has been described with reference to preferred embodiments and illustrations, it will be apparent, to those skilled in the art, that many modifications and changes are possible without departing from the true scope and spirit of the present invention. Therefore, by the appending claims, Applicants intend to cover all such modifications and changes.

What we claim is:

1. A circuit for performing different signal processing functions on digital input data, said data being in the form of binary data words, each word being presented in a bit by bit serial manner to said circuit, each of said different functions being provided by uniquely combining a series of substantially identical algebraic subfunctions performed concurrently on said input data and partially processed input data comprising:

a plurality of substantially identical algebraic digital operating units for receiving and operating on said input data to generate output data or partially processed input data, each said digital operating unit being adapted to perform said identical subfunction, and signal directing means coupled intermediate said units for moving said input data and partially processed data into and through said units concurrently in a plurality of unique patterns, each unique pattern being associated with one of said different signal processing functions, said signal directing means being responsive to preselected user input to direct data through said plurality of units in one of said unique patterns such that said input data is operated on to generate the associated one of said plurality of functions;

said signal directing means including a plurality of data paths, configuration register means for receiving user provided configuration control signals, and multiplexer means responsive to said configuration register means for selectively coupling said data paths to said operating units to thereby direct data through said operating units in one of said patterns as determined by said user provided configuration control signals;

said multiplexer means including a plurality of multiplexer units, one of said units being associated with each of said operating units, said multiplexer units coupled to each of said data paths, each said multiplexer unit being operated to couple its associated operating unit with each of said remaining multiplexer untis via said data paths in response to said configuration control signals;

said operating units further including means for multiplying a first data word by a second data word to provide an intermediate output; and means for adding said intermediate output to a third data word to provide a first operating unit output coupled to an associated multiplexer unit, each said operating unit further including first and second registers, said registers each having an input and an output, said inputs coupled to receive and temporarily store said first and second data words, said outputs coupled to said associated multiplexer unit to enable a delayed replica of said first and second data words to be selectively coupled to others of said operating units in accordance with said configuration eontrol signals.

2. A circuit as recited in claim 1 wherein said signal directing means and said algebraic operating units are formed on a single integrated circuit chip.

3. The circuit recited in claim 2 further including means for directly coupling said first operating unit output to the multiplexer units associated with each adjacent operating unit.

4. The circuit recited in claim 3 further including means for directly coupling the outputs of said first and second registers to the multiplexer units associated with each adjacent operating unit.

5. A circuit as recited in claim 4 further comprising means for providing a delay beween the output of any said operating unit and the input to another said operating unit wherein said multiplexer means is further adapted to selectively couple said delay means to each of said data paths.

6. A circuit as recited in claim 4 further comprising means for truncating the data output of any of said operating units wherein said multiplexer means is further adapted to selectively couple said truncating means to each of said data paths.

7. A circuit for performing different signal processing functions on digital input data, said data being in the form of binary data words, each word being presented in a bit by bit serial manner to said circuit, each of said different functions being provided by uniquely combining a series of substantially identical algebraic subfunctions performed concurrently on said input data and partially processed input data comprising:

a plurality of substantially identical algebraic digital operating units for receiving and operating on said input data to generate output data or partially processed input data, each said digital operating unit being adapted to perform said identical subfunction;

multiplexer means associated with each unit for moving said input data and partially processed data into and through said units concurrently in a plurality of unique patterns, each unique pattern being associated with one of said different signal processing functions;

a configuration register coupled to each multiplexer, said configuration registers being serially coupled to each other in a closed loop fashion; and input means responsive to a user for serially pre-loading a preselected binary code into said configuration registers corresponding to a preselected function to be performed by said circuit, said binary code being operative at each unit to control said associated multiplexer in directing data into and through said units to carry out said preselected function, said preselected code being available before a given operation is begun and fixed during said operation to uniquely determine the paths along which input to and outputs from each unit is directed.

* * * * *